United States Patent [19]

Iwai et al.

[11] Patent Number: 6,045,743
[45] Date of Patent: Apr. 4, 2000

[54] METHOD FOR DRYING RESIN-USED ELECTRONIC PARTS

[75] Inventors: Tatsuo Iwai; Takayuki Watanabe; Hideaki Watanabe; Nobuhisa Ariyoshi; Shigeru Murabayashi; Yoshiaki Inoue, all of Tokyo, Japan

[73] Assignee: Mitsubishi Gas Chemical Company, Inc., Tokyo, Japan

[21] Appl. No.: 08/959,982

[22] Filed: Oct. 29, 1997

[30] Foreign Application Priority Data

Nov. 12, 1996 [JP] Japan ................................. 8-300353

[51] Int. Cl.⁷ .................................................. B29C 35/02
[52] U.S. Cl. ............................................ 264/345; 264/234
[58] Field of Search ..................... 264/344, 345, 264/232, 234; 34/329, 343, 345

[56] References Cited

U.S. PATENT DOCUMENTS

| | | | |
|---|---|---|---|
| 5,204,080 | 4/1993 | Kasori et al. | 423/412 |
| 5,510,166 | 4/1996 | Inoue | 428/76 |
| 5,767,230 | 6/1998 | Scarola et al. | 264/344 |
| 5,885,493 | 3/1999 | Janney et al. | 264/37.18 |

FOREIGN PATENT DOCUMENTS

| | | |
|---|---|---|
| 8-151082 | 6/1996 | Japan . |
| 8-276963 | 10/1996 | Japan . |

*Primary Examiner*—Angela Ortiz
*Attorney, Agent, or Firm*—Armstrong, Westerman, Hattori, McLeland & Naughton

[57] ABSTRACT

Provided is a method for drying resin-used electronic parts which comprises enclosing resin-used electronic parts together with both an oxygen absorbent requiring no moisture for absorption of oxygen and a drying agent in a container having a gas barrier property and then sealing the container and removing oxygen and, preferably, then heating the sealed container. Thereby, no quality deterioration due to oxidation and degradation of a metal surface occurs in a drying step of resin-used electronic parts.

8 Claims, No Drawings

6,045,743

METHOD FOR DRYING RESIN-USED ELECTRONIC PARTS

BACKGROUND OF THE INVENTION

1) Field of the Invention

The present invention relates to a method for drying resin-used electronic parts, and specifically, to a method for drying resin-used electronic parts wherein no quality deterioration due to oxidation and degradation of a metal surface in a drying step of resin-used electronic parts occurs.

Examples of the resin-used electronic parts of the present invention include printed wiring boards such as one side printed wiring boards, both sides printed wiring boards, multilayered printed wiring boards, flexible printed wiring boards, metal core printed wiring boards, discrete wire wiring boards, electrically conductive paint printed wiring boards, ceramic base printed wiring boards, electric resistor printed wiring boards, etc., electric semiconductors, typically including IC and LSI, electric resistors, electric condensers, etc. Further, the method of the present invention is applicable to not only finished products composed of the resin-used electronic parts, but also intermediate products and raw materials thereof.

2) Prior Art

Printed wiring boards perform an important role in mounting since electronic parts are loaded and electrodes are connected. With recent tendency of change to a smaller type of electronic device, its high performance, its high reliability and its low cost, high density and high integration of wiring in electronic devices have been developed. Thus, dimension stability of printed wiring board, cleanliness of metal electric circuit surface, high reliability of printed wiring board during mounting of electronic parts has been required. Therefore, when electronic parts are mounted, moisture and low boiling point organic substances contained in a printed wiring board and remained liquid in washing after coating and etching are usually removed and the printed wiring board is dried in advance to prevent swelling and curvature. For example, a printed wiring board is dried in advance at a high temperature of 100° C. or above for several hours. However, in the drying step, there sometimes occurred such troubles that a surface of metal electric circuit such as copper, aluminum on a printed wiring board was oxidized to cause discoloration of metal portion of the electric circuit; adhesiveness in soldering or wire bonding of electronic parts was lowered and curvature of a printed wiring board due the difference of thermal expansion coefficient between metal and resin was generated.

Also in electronic parts including electric semiconductors, electric resistors, electric condensers, etc., epoxy resin or polyimide resin has been used in package thereof. Thus, in order to remove moisture and low boiling point organic substances contained in the resin portion, electronic parts are dried in advance at a high temperature of 100° C. or above for several hours. Further, recently, even when a polyimide film, as in LOC type electric semiconductor (Lead on Chip), is used as insulating material, drying treatment is usually conducted since when polyimide film with high hygroscopicity absorbs moisture, its dimension is varied; degradation due to corrosion for a metal in a lead part occurs and thus mounting is impeded. However, in such drying treatment method, a metal surface in a lead part has been sometimes oxidized to cause discoloration and adhesiveness was sometimes lowered in the step for soldering or wire bonding of electronic parts.

As methods for preventing oxidation and degradation of metal surface in such drying step of electronic parts, it was attempted to lower the treating temperature or to shorten the drying time. However, although it would be expected to some extent to prevent oxidation of metal surface, there often occurred such problems that it was not perfect to prevent oxidation or drying and removal of evaporating components were insufficient, resulting in swell or crack in soldering during mounting of electronic parts. In drying treatment used a vacuum dryer, although it could be expected to prevent oxidation of a metal surface and to shorten the treating time, there was a problem in cost since expensive exclusive apparatus was necessary. Further although there was also a method for drying electronic parts comprises immersing resin-used electronic parts in advance in a readily vaporizable organic solvent such as flon (CFCs) to replace moisture with the organic solvent and then drying, there occurred environmental problems and a problem in danger of ignition and furthermore a problem that moisture in the atmosphere was re-absorbed during cooling after drying. Thus, under the present situation, no simple and easy method for drying resin-used electronic in which quality deterioration due to oxidation and degradation of a metal surface can be sufficiently prevented, has yet been found.

SUMMARY OF THE INVENTION

An object of the present invention, in order to solve the above-mentioned problems, and to provide a method for drying resin-used electronic parts in which no quality deterioration due to oxidation and degradation of a metal surface occurs.

As a result of an extensive study for solving the above-mentioned prior problems, the present inventors have found that it is necessary to dry resin-used electronic parts under the circumstance removed oxygen and thus to enclose resin-used electronic parts together with both an oxygen absorbent requiring no moisture for absorption of oxygen and a drying agent in a container having a gas barrier property to heat the container, and accomplished the present invention. Surprisingly, it became possible to dry resin-used electronic parts without causing quality deterioration due to oxidation and degradation of a metal surface in a drying step by drying under the above-mentioned atmosphere and furthermore, fear of re-absorption of moisture in the atmosphere during cooling was dissipated since enclosing in the container and its sealing were conducted.

That is, the present invention provides a method for drying resin-used electronic parts which comprises:

enclosing resin-used electronic parts together with both an oxygen absorbent requiring no moisture for absorption of oxygen and a drying agent in a container having a gas barrier property and then sealing the container to heat The present invention provides also a method for drying resin-used electronic parts which comprises:

enclosing resin-used electronic parts together with both an oxygen absorbent requiring no moisture for absorption of oxygen and a drying agent in a container having a gas barrier property, then sealing the container, thus removing oxygen and then heating the sealed container.

The present invention provides also a method for drying resin-used electronic parts which comprises:

enclosing resin-used electronic parts together with an oxygen absorbent requiring no moisture for absorption of oxygen, a drying agent and an acidic gas absorbent in a container having a gas barrier property and then sealing the container to heat.

Further, the present invention provides a method for sealing resin-used electronic parts which comprises:

enclosing resin-used electronic parts together with an oxygen absorbent requiring no moisture for absorption of oxygen, a drying agent and an acidic gas absorbent in a container having a gas barrier property, then sealing the container, thus removing oxygen and then heating the sealed container.

In the present invention, the oxygen absorbent requiring no moisture for absorption of oxygen containing at least one compound selected from the group consisting of unsaturated fatty acid compounds and linear hydrocarbon polymers having an unsaturated group (s) as the main ingredient and a substance to promote oxygen absorption is preferable.

DETAILED DESCRIPTION OF THE INVENTION

The present invention will be described in detail below.

Examples of the resin-used electronic parts of the present invention include printed wiring boards, electric semiconductors used a resin in an insulating portion or an electrically conductive portion including typically, IC and LSI, electric resistors, electric condensers, etc. Further, the method of the present invention is applicable to not only finished products composed of the resin-used electronic parts, but also intermediate products and raw materials thereof.

Examples of printed wiring boards include one side printed wiring boards, both sides printed wiring boards, multilayered printed wiring boards, flexible printing wiring boards, metal core printed wiring boards, discrete wire wiring boards, electrically conductive paint printed wiring boards, ceramic base printed wiring boards, electric resistor printed wiring boards, etc., printed wiring boards (PWB) formed electric circuits or electrodes with copper, aluminum, solder, silver, gold, palladium, etc.

Examples of the package of electric semiconductor used a resin in an insulating portion, in which epoxy type resins are usually often used, include DIP (Dual Inline Package) and SDIP (Shrink-DIP) for through hole mounting, SOP (Small Outline Package) and SIP (Single Inline Package), etc, for surface mounting, QFP (Quad Flat Package), SMT-PGA (Pin Grid Array), TCP (Tape Carrier Package) formed electric circuits with a copper foil on a thin film such as polyimide and the like for surface mounting for fine pitch, BGA (Ball Grid Array) and CSP (Chip Size Package) applied flip chip bonding as so-called area type package. Further, epoxy resins and polyimide resins are used also in electric resistors and electric condensers.

As the resins to be used in electronic parts of the present invention, insulating materials with low dielectric constant are mainly used. Examples of the resins include epoxy resins, polyimide resins, BT resins, thermosetting PPE resins, thermosetting PPO resins, PTFE resins, MS (maleimide-styrene) resins, cyanate ester resins, silicone resins, phenol resins, etc. For example, an epoxy resin laminated a glass cloth is mainly used in printed wiring boards. Further, in PBGA, IC chips are usually loaded on a substrate composed of BT resin, polyimide, etc. An epoxy resin is mainly used as underfill sealing material for flip chip. Electrically conductive adhesives such as electrically conductive bear chip adhesive dispersed a metal(s), in order to ensure electric conductivity or to ensure thermal conductivity for release of heat, are often used in electronic parts. Examples of resins to be used in such adhesive include epoxy resins, acrylic resins, etc.

In the present invention, it is necessary to enclose resin-used electronic parts together with both an oxygen absorbent requiring no moisture for absorption of oxygen and a drying agent and preferably, further an acidic gas absorbent in a container having a gas barrier property and then to seal the container. Immediately after sealing, the container may be subjected to heating treatment. It is preferable to conduct heating treatment after oxygen has been removed. When the oxygen concentration is high, there is possibility that oxidation of a metal surface in the resin-used electronic parts is promoted during drying treatment and discoloration of the metal surface occurs and furthermore bad influence is provided in post-bonding step such as soldering, wire bonding, etc.

The oxygen absorbent to be used in the present invention is not limited on the condition that no moisture for absorption of oxygen is required.

Examples of the oxygen absorbent include an oxygen absorbent containing at least one compound selected from the group consisting of unsaturated fatty acid compounds and linear hydrocarbon polymers having an unsaturated group(s) or thermoplastics such as polyamides, polyolefines as main ingredient and a substance to promote oxygen absorption such as transition metal salts, among which an oxygen absorbent containing at least one compound selected from the group consisting of unsaturated fatty acid compounds and linear hydrocarbon polymers having an unsaturated group(s) as main ingredient and a substance to promote oxygen absorption is preferable.

The unsaturated fatty acid compound to be used herein is an unsaturated fatty acid having at least 10carbon atoms and at least one carbon-carbon double bond, and/or a salt or ester thereof. The unsaturated fatty acids, salts and esters thereof may contain optionally a substituted group(s), e.g., hydroxy group, formyl group, etc. The unsaturated fatty acid compound is not necessarily a kind of substance and may be a mixture of two species or above thereof.

Examples of the unsaturated fatty acid compound include unsaturated fatty acids such as oleic acid, linoleic acid, linolenic acid, arachidonic acid, parinaric acid, dimer acid, ricinoleic acid, etc., fats and oils containing esters, esters thereof and metal salts thereof.

As the unsaturated fatty acid, fatty acids obtained from vegetable oils and animal oils, i.e., linseed oil fatty acid, soybean oil fatty acid, tung oil fatty acid, rice bran oil fatty acid, sesame oil fatty acid, cotton seed oil fatty acid, rapeseed oil fatty acid, tall oil fatty acid, and the like are usable in the present invention.

The linear hydrocarbon polymer having an unsaturated group(s) means a polymer having at least 10 carbon atoms and at least one carbon-carbon double bond and derivatives thereof. The derivatives may optionally contain substituted groups including hydroxyl group(s), amino group(s), formyl group(s), carboxyl group(s), etc.

Examples of the linear hydrocarbon compound having an unsaturated group(s) includes an oligomer or polymer of butadiene, isoprene, 1,3-pentadiene etc. The linear hydrocarbon compound having an unsaturated group(s) is not necessarily a kind of substance and may be a copolymer thereof or a mixture of two species or above thereof and may be contain a small amount of impurities within the ordinary range such as residue of a solvent mixed in during production.

Examples of the substance to promote oxygen absorption include metal salts and radical initiators to promote oxidation of organic compounds. As the metal salts, transition metal salts such as those of Cu, Fe, Co, Ni, Cr, Mn, etc., are preferably used. As the transition metal salts, for example, transition metal naphthenate or transition metal salts of unsaturated fatty acids are preferably used.

When the main ingredient of oxygen absorbent and a substance to promote oxygen absorption are liquid substances but is preferable to support them on a carrier substance.

Examples of the carrier substance include paper or synthetic paper formed of natural pulp or synthetic pulp, non-woven fabric, porous film, silica gel, alumina, activated carbon, synthetic zeolite such as molecular sieves, natural zeolite such as mordenite, erionite, itc., clay minerals as pearlite, activated clay, etc. Further, it is a practical method for use also to select a carrier substance that has also been selected as the drying agent or the acidic gas absorbent and maintain the carrier drying ability and/or acidic gas absorbing ability.

Each component in the oxygen absorbent is used in the following proportions. That is, per 100 parts by weight of a main ingredient, the amount of the substance used to promote oxygen absorption is in the range of 0.01 to 40 parts by weight; that of the carrier substance is in the range of 1 to 1,000 parts by weight.

Examples of the drying agent used in the present invention include paper or synthetic paper formed of natural pulp or synthetic pulp, silica gel, alumina, activated carbon, synthetic zeolite such as molecular sieves, natural zeolite such as mordenite, erionite, etc., pearlite, activated clay, calcium oxide, barium oxide, calcium chloride, barium bromide, calcium hydride, calcium sulfate, magnesium chloride, magnesium oxide, magnesium sulfate, aluminum sulfate, sodium sulfate, sodium carbonate, potassium carbonate, zinc chloride, etc. The drying agent is used alone or in a mixture of two species or above thereof. When a carrier substance of the oxygen absorbent having drying ability or an acidic gas absorbent having drying ability is selected, a drying agent need not be added.

The acidic gas absorbent may be a substance capable of absorbing or adsorbing acidic substances existing in sealing atmosphere or generated during drying treatment. For example, synthetic zeolite such as molecular sieves, natural zeolite such as mordenite, erionite, etc., porous substances, typically, including activated carbon and oxides, hydroxides, carbonates and organic acid salts of alkali metals or alkaline earth metals and organic amines are usable. Further, The acidic gas absorbent is used alone or in a mixture of two species or above. When a carrier substance having acidic gas absorbing function or a drying agent having acidic gas absorbing function is selected, acidic gas absorbent need not be added.

The oxygen absorbent is used in an amount capable of absorbing at least the space volume of oxygen in the interior of a sealed container preferably in an amount of 1.1 to 10 times to the above-mentioned space volume. Further, The drying agent is used in an amount capable of absorbing at least the space volume of moisture in the interior of a sealed container, preferably in an amount of 1.1 to 500 times to the above-mentioned space volume. The oxygen absorbent and the drying agent are suitably used in each respective amount in the above-mentioned ranges depending upon gas barrier performance of the container having a gas barrier property.

In the present invention, the oxygen absorbent, the drying agent and the acidic gas absorbent can be used in a mixture. Each the components or the mixture is used in a form of powders, granules, tablets, sheets, etc.

It is not preferable to permit direct contact between the oxygen absorbent, the drying agent and the acidic gas absorbent with the resin-used electronic parts. They are usually used as a parcel covered with a gas permeable packing material used a substrate, e.g., paper, non-woven fabric, plastic, etc. A portion or all of the oxygen absorbent may be used together with the drying agent and the acidic gas absorbent in one parcel or in separate parcels.

The form of the parcel of the present invention is not limited and may optionally have the form, of e.g., small bag, sheet, blister parcel, etc. Packing materials and structures of the parcel are not limited.

It is preferable to conduct dust proofing treatment on the parcel. As a dust proofing treatment, it is possible to cover a non-dust proofing parcel with material that does not hinder the permeation of either oxygen, moisture or acidic gas and releases no dust generated from the parcel into exterior, thus forming a double-packed parcel. However, when the dust proofing treatment has been conducted for the parcel itself, the parcel need not be further covered with a dust proof material.

The container having a gas barrier property of the present invention is selected depending upon its object and may be a plastic container, a film bag or metallic container, glass container, etc., among which a container having a excellent gas barrier property is preferable.

It is preferable that the container have a heat resistant property above drying temperature for drying treatment.

It is preferable that the container having a gas barrier property of the present invention has an oxygen permeability of 10 ml/m$^2$. Day . atm or below at 25° C. at a relative humidity (hereinafter, referred to as "RH") of 60% and a water vapor permeability of 1 g/m$^2$. Day or below at 40° C. at 90% RH.

It is advantageous in cost to select the gas barrier performance to be so as not to provide excess performance. On the other hand, when the resin-used electronic parts are enclosed in a container and then sealed, the interior of the container may be replaced with a dry inert gas such as nitrogen, argon, etc. Such gas replacement leads to reduction of amount of the oxygen absorbent and the drying agent, particularly, the oxygen absorbent.

The method of the present invention comprises enclosing resin-used electronic parts together with an oxygen absorbent requiring no moisture and a drying agent in a container having a gas barrier property and then sealing the container, and usually, then conducting drying treatment of the container.

The heating and drying treatment temperature is 20 to 200° C., more preferably 40 to 120° C. and most preferably 60 to 110° C. Usually, a heating and drying temperature below each heat resisting temperature of oxygen absorbent, drying agent acidic gas absorbent and a parcel thereof, a temperature below heat resisting temperature of a material of the container having a gas barrier property and a temperature below heat resisting temperature of resin-used electronic parts is preferable.

It is preferable that the heating and drying treatment time is 1 to 24 hours in the case of 100° C. and one week or above in the case of 20 to 30° C., depending upon the heating and drying treatment temperature.

The heating and drying treatment conditions vary depending upon an amount of intended resin-used electronic parts, moisture absorption proportion before heating and drying treatment and moisture absorption proportion as final target, an amount of the drying agent and its moisture absorption performance. For example, it is possible to shorten the heating and drying treatment time by conducting the drying treatment at a high temperature. On the other hand, it is possible to reduce treating cost and suppress degradation of parts due to heat by conducting the heating and drying treatment at a low temperature, though the treatment time becomes long.

The heating and drying treatment may be conducted at a high temperature immediately after the container enclosed resin-used electronic parts has been sealed. It is preferable to conduct the drying and heating treatment after an oxygen concentration in the sealed container has been become low. When the heating and drying treatment is conducted in the state that oxygen still remains in the sealed atmosphere, there is possibility that a metal surface of electronic parts suffers oxidation and degradation to a certain degree with remained oxygen. Therefore, in order to conduct the heating and drying treatment for the resin-used electronic parts without suffering substantially influence of oxygen, it is preferable to allow to stand the sealed container at a room temperature until the oxygen absorbent has completed absorption of oxygen in the sealed container. In such case, the time necessary to absorb oxygen in the sealed container depends upon absorption capacity and an amount of oxygen absorbent enclosed together and an amount of oxygen contained in the interior space of the sealed container. When the standing time at a room temperature is short, oxygen in the sealed container cannot be sufficiently absorbed, so that there is possibility that oxidation and degradation of metal surface occur during the heating and drying treatment. Further, when the standing time is long, it is preferable and no problem occurs since absorbing time is merely prolonged and the resin-used electronic parts can be preserved for a long time in such state as they are until the drying and heating treatment are conducted. On the other hand, moisture and acidic gas contained in the sealed container, vaporized from the resin-used electronic parts or generated from a material of enclosed case or cushion can be removed with the drying agent and the acidic gas absorbent during the standing time.

In the present invention, there is no fear of oxidation and degradation due to oxygen in the atmosphere during cooling and re-absorption of moisture since since the cooling after the drying and heating treatment of resin-used electronic parts can be conducted in the state of the sealed container. Further, after cooling, drying-treated resin-used electronic parts can be preserved in such form as they are until just before they are used.

According to the present invention, very simple and easy method which comprises enclosing resin-used electronic particles together with both an oxygen absorbent requiring no moisture for absorption of oxygen and a drying agent and further, preferably an acidic gas absorbent in a container having a gas barrier property and sealing the container to heat, is provided. By such method, resin-used electronic parts are easily dried without occurrence of their quality deterioration due to oxidation and degradation of metal surface in a drying step.

PREFERRED EMBODIMENTS OF THE INVENTION

Some of the preferred embodiments of the present invention will be described in detail below, referring to Examples, which are not intended to limit the scope of the present invention

EXAMPLE 1

Preparation of gas absorbent parcel A 350 parts by weight of natural zeolite (mordenite) and a mixture of 100 parts by weight of soybean oil as unsaturated organic compound of main ingredient with 20 parts by weight of cobalt naphthenate (Co content, 8% by weight) as a substance to promote absorption of oxygen were mixed with a blender. The resultant mixture was allowed to stand at 25° C. for 10 minutes to form a granular with flowability, thus obtaining the oxygen absorbent.

5 g of oxygen absorbent thus obtained was mixed with 5 g of calcium oxide as drying agent and acidic gas absorbent and the mixture thus obtained was filled into a small bag (inner size: 5 cm×10 cm) formed of paper, laminated porous polyethylene film on its inside, thus preparing the gas absorbent parcel A (hereinafter, referred to as "gas absorbent A").

Preparation of printed wiring board

Printed wiring board A wherein IPC multiobjective test pattern (IPC-B-25) was drawn on a one side copper coated-glass epoxy substrate of 101.6 mm×114.3 mm×1.6 mm, manufactured by Mitsubish Gas Chemical Co., Inc., Japan, EDOLITE, CCLEL 2-170NV) , was prepared.

Experiment of heating and drying treatment

One board of printed wiring board A and one parcel of gas absorbent A prepared above were enclosed with 500 ml of air at 25° C. and at 75% RH in a packing bag formed of an aluminum foil laminate (stretched polypropylene/aluminum foil/polyethylene): size 220 mm×300 mm (hereinafter, referred to as "Al bag") and then the opened portion of the Al bag was heat sealed to seal hermetically. The hermetically sealed Al bag was allowed to stand for 2 days under an atmosphere of 25° C. and 60% RH.

After standing for 2 days, removal of oxygen in the Al bath was confirmed. Then, heating and drying treatment of the Al bag after standing was conducted for 6 hours in a dryer of 80° C. After the completion of the heating and drying treatment, the Al bag was cooled to a room temperature. Then, both the oxygen concentration and moisture concentration in the sealed Al bag were determined by gas chromatography. It was found that neither oxygen nor moisture were substantially present in the interior of the sealed Al bag. The sealed Al bag was opened and the printed wiring board A was taken out. Observation of appearance of the printed wiring board A thus taken out, measurement of oxidized film thickness of copper wiring surface and evaluation of its delamination based upon Handaryflow (235° C., 5 minutes) and occurrence of swelling were conducted. No oxidation and degradation of the copper wiring occurred and furthermore neither delamination nor swelling occurred. Thus, it was confirmed that good heat and dry treatment was conducted. The results were shown in Table 1.

COMPARATIVE EXAMPLES 1 TO 2

The experiments of heating and drying treatment and evaluation were conducted in the same manner as in Example 1 except that the heating and drying treatment of one board of printed wiring board A was conducted at 130° C. for 6 hours in comparative Example 1 and at 80° C. for 6 hours in Comparative Example 2 in an open state without enclosing the printed wiring board A in a container having a gas barrier property. In Comparative Examples 1 and 2, the surface of copper wiring on the printed wiring board A presented reddish and increase of oxidized film thickness of copper was observed. The results were shown in Table 1.

COMPARATIVE EXAMPLES 3 TO 5

The experiments of heating and drying treatment and evaluation were conducted in the same manner as in Example 1 except that both one board of printed wiring board A and one parcel containing 10 g of trademark Fuji Silicagel, A type, made by FUJI-DAVISONCHEMICAL LTD., Japan in Comparative Example 3, both one board of printed wiring board A and one parcel of moisture-holding type iron powder oxygen absorbent, trademark Ageless Z-100PT, made by Mitsubishi Gas Chemical Co., Inc., Japan in Comparative Example 4, and only one board of printed wiring board A without enclosing gas absorbent in Comparative Example 5, respectively were enclosed together with 500 ml of air at 25° C. and at 75% RH in Al bags and then all of the Al bags were hermetically sealed. The results were shown in Table 2.

EXAMPLES 2 TO 4

In Examples 2 to 4, the gas absorbents B, C and D were prepared in the same manner as in Example 1 except that the combination between main ingredient and a substance to promote oxygen absorption in the gas absorbent A of Example 1 was changed respectively as follows:

| Example | gas absorbent | main ingredient of oxygen absorbent (100 parts by weight) | substance to promote oxygen absorption (2 parts by weight) |
| --- | --- | --- | --- |
| 1 | A | soybean oil | cobalt naphthanate |
| 2 | B | tall oil fatty acid | cobalt salt of tall oil fatty acid(**) |
| 3 | C | soybean oil | cobalt salt of tall oil fatty acid(**) |
| 4 | D | soybean oil + liquid polyisoprene(*) | cobalt naphthenate | note:
(*) the mixture ratio of soybean oil: liquid polysioprene (trademark Dynaclean R113, made by Japan Synthetic Rubber Co., Japan) = 6.4 (ratio by weight)
(**) cobalt content: 6% by weight The experiments of heating and drying treatment and evaluation were conducted in the same manner as in Example 1 except that gas absorbents B, C and D, respectively, in Examples 2 to 4 were used instead of gas absorbent A. The results were shown in Table 3. In Examples 2 to 4, after the heating and drying treatment, no change of appearance was observed and prevention effects of oxidation for copper wiring on printed wiring board A was confirmed.

EXAMPLE 5

Production of gas absorbent parcel E

The gas absorbent parcel E (hereinafter, referred to as "gas absorbent E") was prepared in the same manner as in Example 1 except that 4 g of oxygen absorbent used in Example 1 and 4 g of calcium oxide were used instead of 5 g of oxygen absorbent and 5 g of calcium oxide.

Preparation of printed wiring board

Four layers printed wiring board of 0.4 mm thickness wherein BT resin substrate of 150 mm×210 mm×0.1 mm, manufactured by Mitsubishi Gas Chemical Co., Inc., Japan, CCL-HL832, drawn IPC multiobjective test pattern (IPC-B-25) thereon as core material and GHPL830 as bonding sheet were used, was prepared. Further, IPC objective test pattern was drawn on both sides of the four layers printed wiring board thus obtained, thus obtaining printed wiring board B. The printed wiring board B thus obtained was allowed to stand in nitrogen at 40° C. and at 60% RH for 10 days, thus obtaining moisture-absorbed printed wiring board B. Immediately, its weight was measured. Moisture absorption percentage of moisture-absorbed printed wiring board B was calculated by using a measured weight of substrate in an absolutely dry state. It was 0.31 wt %.

Moisture absorption percentage
  moisture absorption percentage=moisture quantity/ (weight of substrate in an absolutely dry state)×100

Weight of substrate in an absolutely dry state
  Substrate after test was placed in a dryer at 120° C. for 2 days and then weight of substrate in an absolutely dry state was measured.

Moisture quantity of substrate
Weight of substrate was measured.
  moisture quantity of substrate=weight of substrate− (weight of substrate in an absolutely dry state)

Experiment of heating and drying treatment

Five boards of moisture-absorbed printed wiring board B and one bag of gas absorbent prepared above were enclosed with 500 ml of air at 25° C. and at 75% RH in Al bag : size 220 mm×300 mm and then the opened portion of the Al bag was heat sealed to seal hermetically. The hermetically sealed Al bag was allowed to stand for one day under an atmosphere of 25° C. and 60% RH. After standing for one day, removal of oxygen in the Al bag (oxygen concentration ; 0.08%) was confirmed. Then, heating and drying treatment of the Al bag after standing was conducted for 12 hours in a dryer of 80° C. After the completion of the heating and drying treatment, the Al bag was cooled to a room temperature. Then, the oxygen concentration in the Al bag was measured. The sealed Al bag was opened and the printed wiring board B was taken out. The weight of the printed wiring board B thus taken out was measured and oxidized film thickness of copper wiring was measured. The delamination and swelling of the printed wiring board B were measured by immersing it in a soldering bath molten by heating to 260° C. for 30 seconds. The results were shown in Table 4.

EXAMPLE 6

The experiment of heating and drying treatment and evaluation were conducted in the same manner as in Example 5 except that heating and drying treatment of the hermetically sealed Al bag was conducted immediately without allowing to stand for one day under an atmosphere of 25° C. and 60% RH. The results were shown in Table 4.

COMPARATIVE EXAMPLES 6 TO 8

The experiments of heating and drying treatment and evaluation were conducted in the same manner as in Example 5 except that both five boards of printed wiring board B and one parcel containing 10 g of trademark Fuji Silicagel, A type, made by JUJI-DAVISONCHEMICAL LTD., Japan in Comparative Example 6, both five boards of printed wiring board B and one parcel of moisture-holding type iron powder oxygen absorbent, trademark Ageless Z-100PT, made by Mitsubishi Gas Chemical Co., Inc., Japan in Comparative Example 7, and only five boards of printed wiring board B without enclosing gas absorbent in Comparative Example 8, respectively were enclosed together with 500 ml of air at 25° C. and at 75% RH in Al bags and then all of the Al bags were hermetically sealed. The results were shown in Table 5.

EXAMPLES 7 TO 9

Production of gas absorbent parcels F, G and H 4 g of oxygen absorbent used in Example 1 was mixed with 4 g of calcium chloride anhydride in Example 7, 4 g of magnesium sulfate $\overline{1/2}$ hydrate in Example 8 and 4 g of diphosphorus pentaoxide in Example 9, respectively, as drying agent and the mixture thus obtained was filled into a small bag formed of paper laminated porous polyethylene film on its inside (inner size ; 5 cm×10 cm), thus preparing the gas absorbent parcels F, G and H (hereinafter, referred to as "gas absorbents F, G and H")

Experiment of heating and drying treatment

The experiment of heating and drying treatment of printed wiring board B and evaluation were conducted in the same manner as in Example 5 except that gas absorbents F, G and H, respectively, were used instead of gas absorbent E. The results were shown in Table 6.

EXAMPLE 10

BGA (manufactured by CITIZEN WATCH Co., LTD; Japan, PBGA-352 pin) was allowed to stand in a nitrogen for 3 days at 85° C. and at 85% RH and to absorb moisture. Immediately after 3 days, weight of the BGA was measured and moisture-absorption percentage was determined. 10 pieces of BGA thus moisture-absorbed and one parcel of gas absorbent E was enclosed with 500 ml of air at 25° C. and at 75% RH in Al bag used Example 5 and then the opened portion of the Al bag was heat sealed to seal hermetically. The hermetically sealed Al bag was allowed to stand for one day under an atmosphere of 25° C. and 60% RH.

After standing for one day, removal of oxygen in the Al bag (oxygen concentration; 0.09%) was confirmed. Then, heating and drying treatment of the Al bag after standing was conducted for 24 hours in a dryer of 80° C. Immediately after the completion of the heating and drying treatment, the Al bag was cooled to a room temperature. Then, the oxygen concentration in the Al bag was measured. Then, the sealed Al bag was opened and the BGA was taken out. The weight of the BGA thus taken out was measured and moisture-absorption percentage was determined, and appearance of soldering ball in back side of BGA was observed by stereoscopic microscope of 20 magnifications. Further, the BGA was immersed for 30 seconds in a soldering bath molten by heating to 260° C. and appearance of the BGA was observed. The moisture-absorption percentage of the BGA was determined according to the method of printed wiring board B described in Example 5. The results were shown in Table 7.

COMPARATIVE EXAMPLE 9

The experiment of heating and drying treatment was conducted in the same manner as in Example 5 except that BGA absorbed moisture in the same manner as in Example 10 was used instead of printed wiring board B absorbed moisture and neither enclosed in Al bag nor hermetically sealed. Then, the same evaluation as in Example 10 was conducted. Slight cloudiness of soldering ball was observed and oxidation and degradation occurred in some degree. The results were shown in Table 7.

EXAMPLE 11

QFP (manufacture by Taiwan Memory Technology Inc., MQFP 100) was allowed to stand in a nitrogen for 3 days at 85° C. and at 85% RH and to absorb moisture. Immediately after 3 days, thus obtaining moisture-absorbed QFP. Moisture-absorption percentage of the QFP was determined and 0.30 wt %. 10 pieces of QFP thus moisture-absorbed and one bag of gas absorbent E was enclosed with 500 ml of air at 25° C. and at 75% RH in Al bag used Example 1 and then the opened portion of the Al bag was heat sealed to seal hermetically. The hermetically sealed Al bag was allowed to stand for one day under an atmosphere of 25° C. and 60% RH.

After standing for one day, removal of oxygen in the Al bag (oxygen concentration; 0.09%) was confirmed. Then, heating and drying treatment of the Al bag after standing was conducted for 24 hours in a dryer of 80° C. Immediately after the completion of the heating and drying treatment, the Al bag was cooled to a room temperature. Then, the oxygen concentration in the Al bag was measured. Then, the sealed Al bag was opened and the QFP was taken out. The weight of the QFP thus taken out was measured and moisture-absorption percentage was determined. and appearance of soldered lead of QFP was observed by stereoscopic microscope of 20 magnifications. No discoloration was observed and initial appearance was maintained. Then, immediately, the QFP was immersed piece by piece for 30 seconds in a soldering bath molten by heating to 260° C. to cut and polish and appearance of cross section of the QFP was observed and no crack was observed. The moisture-absorption percentage of the QFP was determined according to the method of printed wiring board B described in Example 5. The results were shown in Table 8.

COMPARATIVE EXAMPLE 10

The experiment of heating and drying treatment was conducted in the same manner as in Example 11 except that QFP absorbed moisture in the same manner as in Example 11 was used and neither enclosed in Al bag nor hermetically sealed. Then, the same evaluation as in Example 11 was conducted. The results were shown in Table 8.

TABLE 1

|  | Example 1 | Comp. Ex. 1 | Comp. Ex. 2 | Before treatment |
| --- | --- | --- | --- | --- |
| Heating and drying treatment conditions |  |  |  |  |
| Temperature, ° C. | 80 | 130 | 80 | — |
| Time, hr | 6 | 6 | 6 | — |
| Interior of bag after heating and drying treatment |  | Open system | Open system |  |
| Oxygen concentration, % | 0.03 | — | — | — |
| Humidity, % RH | <1 | — | — | — |
| After heating and drying treatment |  |  |  |  |
| Color change of copper wiring | No color change occurred | Redness increased | Redness increased | — |
| Oxidized film thickness | 3.5 | 9.4 | 7.8 | 3.5 |

TABLE 1-continued

|  | Example 1 | Comp. Ex. 1 | Comp. Ex. 2 | Before treatment |
| --- | --- | --- | --- | --- |
| of copper, nm |  |  |  |  |
| Delamination | not occurred | not occurred | not occurred | occurred |
| Swelling | not occurred | not occurred | not occurred | occurred |

TABLE 2

|  | Example 1 | Comp. Ex. 3 | Comp. Ex. 4 | Comp. Ex. 5 |
| --- | --- | --- | --- | --- |
| Treatment in bag | Gas absorbent of the present invention was enclosed | Drying agent was enclosed | Moisture holding type iron powder oxygen absorbent was enclosed | No treatment was conducted |
| Interior of bag after heating and drying treatment |  |  |  |  |
| Oxygen concentration, % | 0.03 | 21 | 0.05 | 21 |
| Humidity, % RH | <1 | 2 | 85 | 75 |
| After heating and drying treatment |  |  |  |  |
| Color change of copper wiring | No color change occurred | Slight redness occurred | No color change occurred | Redness increased |
| Oxidized film thickness of copper, nm | 3.5 | 5.4 | 3.8 | 7.5 |
| Delamination | not occurred | not occurred | not occurred | occurred |
| Swelling | not occurred | not occurred | not occurred | occurred |

TABLE 3

|  | Example 1 | Example 2 | Example 3 | Example 4 |
| --- | --- | --- | --- | --- |
| Oxygen absorbent |  |  |  |  |
| Organic compound as main ingredient | Soybean oil | Tall oil fatty acid | Soybean oil | Soybean oil + poly-isoprene |
| Substance to promote oxygen absorption | Cobalt naph-thenate | Cobalt salt of tall oil fatty acid | Cobalt salt of tall oil fatty acid | Cobalt naph-thenate |
| Interior of bag after heating and drying treatment |  |  |  |  |
| Oxygen concentration, % | 0.03 | 0.03 | 0.04 | 0.03 |
| Humidity, % RH | <1 | <1 | <1 | <1 |
| After heating and drying treatment |  |  |  |  |
| Color change of copper wiring | No color change occurred | No color change occurred | No color change occurred | No color change occurred |
| Oxidized film thickness of copper, nm | 3.5 | 3.5 | 3.5 | 3.5 |
| Delamination | not occurred | not occurred | not occurred | not occurred |

TABLE 3-continued

|  | Example 1 | Example 2 | Example 3 | Example 4 |
| --- | --- | --- | --- | --- |
| Swelling | not occurred | not occurred | not occurred | not occurred |

TABLE 4

|  | Example 5 | Example 6 | Before treatment |
| --- | --- | --- | --- |
| Heating and drying treatment conditions |  |  |  |
| Temperature, °C. | 25 | — | — |
| Time, day | 1 | — | — |
| Temperature, °C. | 80 | 80 | — |
| Time, hr | 12 | 12 | — |
| Interior of bag after heating and drying treatment |  |  |  |
| Oxygen concentration, % | 0.03 | 0.04 | — |
| Moisture absorption percentage of printed wiring board B, % | 0.07 | 0.09 | 0.31 |
| After heating and drying treatment |  |  |  |
| Color change of copper wiring | No color change occurred | No color change occurred | — |
| Oxidized film thickness of copper, nm | 3.5 | 3.8 | 3.5 |
| Delamination | not occurred | not occurred | occurred |
| Swelling | not occurred | not occurred | occurred |

TABLE 5

|  | Comp. Ex. 6 | Comp. Ex. 7 | Comp. Ex. 8 | Before treatment |
| --- | --- | --- | --- | --- |
| Treatment in bag | Drying agent was enclosed | Moisture holding type iron powder oxygen absorbent was enclosed | No agent was used | — |
| Interior of bag after heating and drying treatment |  |  |  |  |
| Oxygen concentration, % | 21 | 0.05 | 21 | — |
| Moisture absorption percentage of printed wiring board B, % | 0.10 | 0.32 | 0.31 | 0.31 |
| After heating and drying treatment |  |  |  |  |
| Color change of copper wiring | Slight redness occurred | No color change occurred | Slight redness occurred | — |
| Oxidized film thickness of copper, nm | 4.8 | 3.9 | 6.4 | 3.5 |
| Delamination | not occurred | occurred | occurred | occurred |
| Swelling | not occurred | occurred | occurred | occurred |

TABLE 6

|  | Example 7 | Example 8 | Example 9 |
|---|---|---|---|
| Drying agent | Calcium chloride anhydride | Magnesium sulfate ½ hydrate | Diphosphorus pentaoxide |
| Interior of bag after heating and drying treatment |  |  |  |
| Oxygen concentration, % | 0.03 | 0.04 | 0.04 |
| Moisture absorption percentage of printed wiring board B, % | 0.09 | 0.07 | 0.04 |
| After heating and drying treatment |  |  |  |
| Color change of copper wiring | No color change occurred | No color change occurred | No color change occurred |
| Oxidized film thickness of copper, nm | 3.5 | 3.7 | 3.5 |
| Delamination | not occurred | not occurred | not occurred |
| Swelling | not occurred | not occurred | not occurred |

TABLE 7

|  | Example 10 | Comp. Ex. 9 | Before treatment |
|---|---|---|---|
| Heating and drying treatment conditions |  |  |  |
| Temperature, °C. | 25 | 25 | — |
| Time, day | 1 | 1 | — |
| Temperature, °C. | 80 | 80 | — |
| Time, hr | 24 | 24 | — |
| Interior of bag after heating and drying treatment |  | Open system | — |
| Oxygen concentration, % | 0.03 | — | — |
| Moisture absorption percentage of BGA, % | 0.08 | 0.05 | 0.28 |
| After heating and drying treatment |  |  |  |
| Appearance of solder ball | No color change occurred | Slight cloudiness occurred | — |
| Swelling | not occurred | not occurred | occurred |

TABLE 8

|  | Example 11 | Comp. Ex. 10 | Before treatment |
|---|---|---|---|
| Treatment in bag | Gas absorbent of the present invention was enclosed | Open system |  |
| Interior of bag after heating and drying treatment |  |  |  |
| Oxygen concentration, % | 0.03 | — | — |
| Moisture absorption percentage of QFP, % | 0.05 | 0.04 | 0.30 |
| After heating and drying treatment |  |  |  |
| Color change of lead portion | No color change occurred | Slight cloudiness occurred | — |
| Inner cracking | not occurred | not occurred | occurred |

What is claimed is:

1. A method for drying resin-used electronic parts which comprises:

enclosing resin-used electronic parts together with both an oxygen absorbent requiring no moisture for absorption of oxygen and a drying agent in a container having a gas barrier property and then sealing the container to heat at a temperature of 40 to 120° C.

2. A method for drying resin-used electronic parts according to claim 1, wherein the oxygen absorbent requiring no moisture for absorption of oxygen contains at least one compound selected from the group consisting of unsaturated fatty acid compounds and linear hydrocarbon polymers having an unsaturated group (s) as the main ingredient and a substance to promote oxygen absorption.

3. A method for drying resin-used electronic parts which comprises:

enclosing resin-used electronic parts together with both an oxygen absorbent requiring no moisture for absorption of oxygen and a drying agent in a container having a gas barrier property, then sealing the container, thus removing oxygen and then heating the sealed container at a temperature of 40 to 120° C.

4. A method for drying resin-used electronic parts according to claim 3, wherein the oxygen absorbent requiring no moisture for absorption of oxygen contains at least one compound selected from the group consisting of unsaturated fatty acid compounds and linear hydrocarbon polymers having an unsaturated group (s) as the main ingredient and a substance to promote oxygen absorption.

5. A method for drying resin-used electronic parts which comprises:

enclosing resin-used electronic parts together with an oxygen absorbent requiring no moisture for absorption of oxygen, a drying agent and an acidic gas absorbent in a container having a gas barrier property and then sealing the container to heat at a temperature of 40 to 120° C.

6. A method for drying resin-used electronic parts according to claim 5, wherein the oxygen absorbent requiring no moisture for absorption of oxygen contains at least one compound selected from the group consisting of unsaturated fatty acid compounds and linear hydrocarbon polymers having an unsaturated group (s) as the main ingredient and a substance to promote oxygen absorption.

7. A method for drying resin-used electronic parts which comprises:

enclosing resin-used electronic parts together with an oxygen absorbent requiring no moisture for absorption of oxygen, a drying agent and an acidic gas absorbent in a container having a gas barrier property then sealing the container thus removing oxygen and then heating the sealed container at a temperature of 40 to 120° C.

8. A method for drying resin-used electronic parts according to claim 7, wherein the oxygen absorbent requiring no moisture for absorption of oxygen contains at least one compound selected from the group consisting of unsaturated fatty acid compounds and linear hydrocarbon polymers having an unsaturated group (s) as the main ingredient and a substance to promote oxygen absorption.

* * * * *